(12) United States Patent
Shirakawa et al.

(10) Patent No.: US 9,496,088 B2
(45) Date of Patent: Nov. 15, 2016

(54) ELECTRONIC COMPONENT AND METHOD OF MANUFACTURING ELECTRONIC COMPONENT

(71) Applicant: TDK CORPORATION, Tokyo (JP)

(72) Inventors: Yukihiko Shirakawa, Tokyo (JP); Tatsuo Inagaki, Tokyo (JP); Shintaro Kon, Nikaho (JP); Osamu Hirose, Tokyo (JP); Masahiko Konno, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 14/923,999

(22) Filed: Oct. 27, 2015

(65) Prior Publication Data

US 2016/0049257 A1 Feb. 18, 2016

Related U.S. Application Data

(63) Continuation of application No. 13/487,608, filed on Jun. 4, 2012, now Pat. No. 9,202,627.

(30) Foreign Application Priority Data

Jun. 9, 2011 (JP) .................................. 2011-129441

(51) Int. Cl.
*H01G 4/228* (2006.01)
*H01G 4/30* (2006.01)
*H01G 4/12* (2006.01)
(Continued)

(52) U.S. Cl.
CPC ................ *H01G 4/30* (2013.01); *H01G 4/012* (2013.01); *H01G 4/12* (2013.01); *H01G 4/232* (2013.01); *H01G 4/2325* (2013.01); *H01G 4/248* (2013.01); *H05K 1/181* (2013.01); *H05K 3/3442* (2013.01); *H05K 2203/046* (2013.01)

(58) Field of Classification Search
USPC .......................... 361/303, 311, 301.4, 306.3
See application file for complete search history.

(56) References Cited

U.S. PATENT DOCUMENTS 5,712,758 A 1/1998 Amano et al.
6,515,844 B1 2/2003 Moriwaki et al.
(Continued)

FOREIGN PATENT DOCUMENTS

CN 1503279 A 6/2004
CN 101499340 A 8/2009
(Continued)

OTHER PUBLICATIONS

Aug. 3, 2015 Notice of Allowance issued in U.S. Appl. No. 13/487,608.
(Continued)

*Primary Examiner* — Eric Thomas
(74) *Attorney, Agent, or Firm* — Oliff PLC

(57) ABSTRACT

An electronic component comprises an element body and an outer electrode. The element body has a pair of end faces opposing each other, a pair of main faces opposing each other while extending so as to connect the pair of end faces to each other, and a pair of side faces opposing each other while extending so as to connect the pair of main faces to each other. The outer electrode is formed on the end face side of the element body and covers a portion of the main and side faces adjacent to the end face. At least a surface of an electrode portion of the outer electrode located on the side face side thereof is covered with an insulating layer.

5 Claims, 18 Drawing Sheets

(51) Int. Cl.
   *H01G 4/232* (2006.01)
   *H01G 4/012* (2006.01)
   *H01G 4/248* (2006.01)
   *H05K 1/18* (2006.01)
   *H05K 3/34* (2006.01)

(56) References Cited

U.S. PATENT DOCUMENTS

| | | | |
|---|---|---|---|
| 6,627,509 B2 | 9/2003 | Duva | |
| 6,683,782 B2 | 1/2004 | Duva | |
| 7,813,104 B2 | 10/2010 | Nakano et al. | |
| 2003/0231477 A1* | 12/2003 | Vierow | H01G 4/38 361/801 |

FOREIGN PATENT DOCUMENTS

| | | |
|---|---|---|
| JP | H02-17619 A | 1/1990 |
| JP | H02-155209 A | 6/1990 |
| JP | H02-137023 U | 11/1990 |
| JP | H06-70227 U | 9/1994 |
| JP | H06-244051 A | 9/1994 |
| JP | H08-162357 A | 6/1996 |
| JP | H09-180957 A | 7/1997 |
| JP | H11-251177 A | 9/1999 |
| JP | 2001-044069 A | 2/2001 |
| JP | 2002-359103 A | 12/2002 |
| JP | 2003-243252 A | 8/2003 |
| JP | 2006-013315 A | 1/2006 |

OTHER PUBLICATIONS

Dec. 31, 2014 Office Action issued in U.S. Appl. No. 13/487,608.
Sep. 30, 2014 Office Action issued in Japanese Application No. 2011-129441.
Sep. 26, 2014 Notice of Allowance issued in U.S. Appl. No. 13/487,608.
Jun. 2, 2014 Office Action issued in U.S. Appl. No. 13/487,608.

* cited by examiner

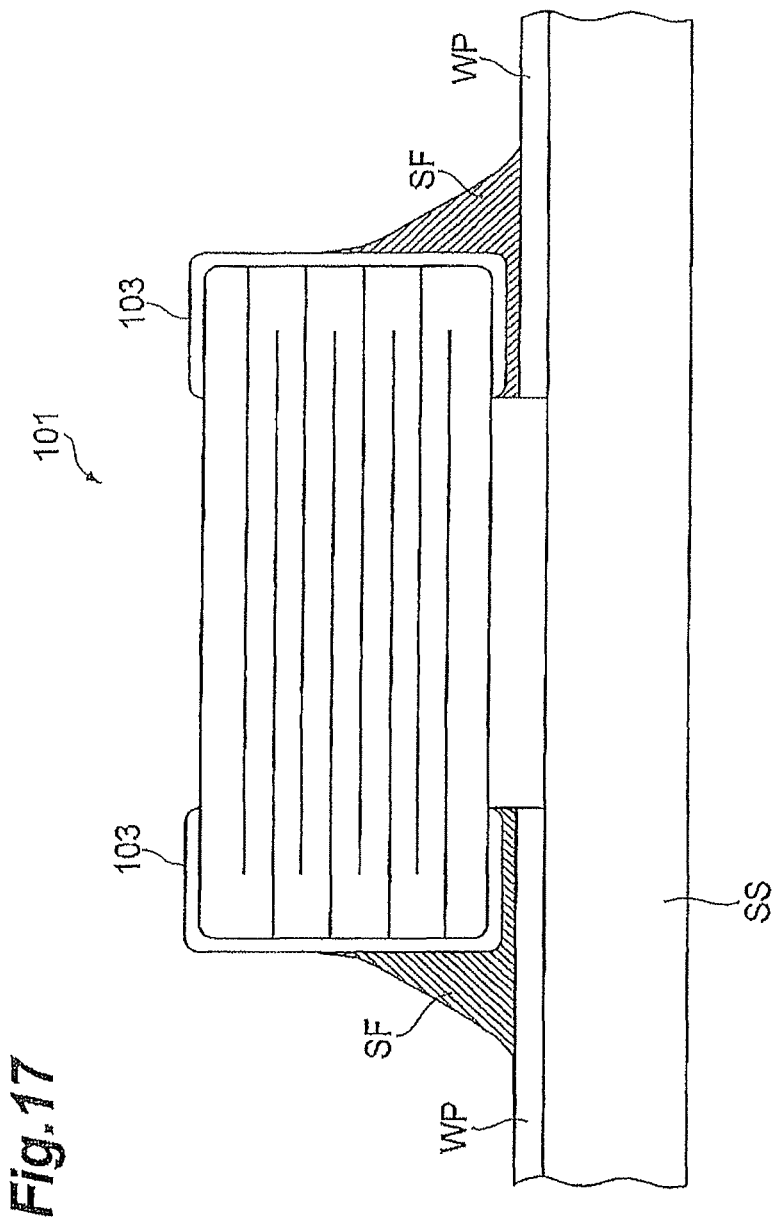

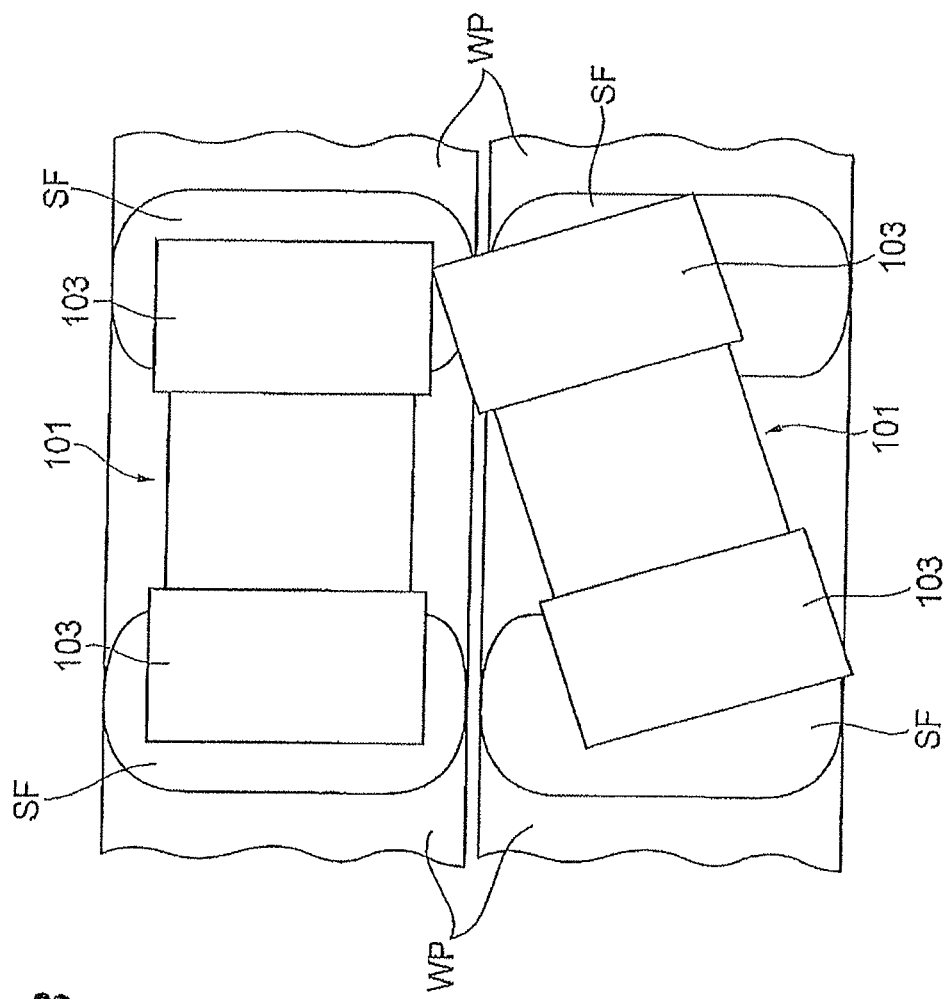

ELECTRONIC COMPONENT AND METHOD OF MANUFACTURING ELECTRONIC COMPONENT

This is a Continuation application of application Ser. No. 13/487,608 filed Jun. 4, 2012 which claims priority to JP 2011-129441 filed Jun. 9, 2011. The disclosures of the prior applications are hereby incorporated by reference herein in their entirety.

BACKGROUND OF THE INVENTION

1. Field of the Invention

The present invention relates to an electronic component, a surface mounting type electronic component in particular, and a method of manufacturing the same.

2. Related Background Art

Conventionally, as a method of manufacturing a surface mounting type electronic component (e.g., a multilayer ceramic capacitor), the following method has been used widely (see, for example, Japanese Patent Application Laid-Open No. 2006-13315). Green sheets and inner electrode materials are alternately stacked and then fired, so as to form an element body. End faces of the element body are dipped into a conductive paste, and the conductive paste applied to the element body is dried, so as to form paste layers on the element body. Thereafter, the paste layers are sintered and then plated for improving soldability, so as to form outer electrodes on the element body.

SUMMARY OF THE INVENTION

In the above-mentioned conventional method of manufacturing an electronic component, the outer electrodes are formed over both end faces of the element body and a part of main and side faces adjacent to the end faces. That is, each outer electrode has a structure formed over five surfaces of the element body.

As illustrated in FIGS. 14 to 17, when an electronic component 101 is mounted by soldering to a substrate SS provided with a wiring pattern WP, solder travels to outer electrodes 103 formed on side faces of the electronic component 101, so as to produce solder fillets SF on side faces of the outer electrodes 103 as well. When a plurality of electronic components 101 are mounted in parallel with each other, there is a fear of solder bridges being formed between side faces of the electronic components 101 adjacent to each other. Therefore, a problem of short-circuiting is more likely to occur between the electronic components 101, thus making it harder to achieve close adjacent high-density mounting in which the distance between the electronic components 101 is small. When a positional deviation occurs at the time of mounting the electronic components 101 as illustrated in FIG. 18, both side faces of the electronic components 101 adjacent to each other may come into contact with each other. This may cause short-circuiting between the electrodes of the electronic components 101.

For overcoming the problem mentioned above, it is an object of the present invention to inexpensively provide an electronic component and a method of manufacturing an electronic component which enable high-density mounting of electronic components.

In one aspect, the present invention provides an electronic component comprising an element body having a pair of end faces opposing each other, a pair of main faces opposing each other while extending so as to connect the pair of end faces to each other, and a pair of side faces opposing each other while extending so as to connect the pair of main faces to each other; and an outer electrode, formed on the end face side of the element body, for covering a portion of the main and side faces adjacent to the end face; wherein at least a surface of an electrode portion of the outer electrode located on the side face side thereof is covered with an insulating layer.

Since solder wets only metals, the insulating layer functions as a solder resist layer. Therefore, when the electronic component of the present invention is mounted to a substrate, solder does not wet the portion of the outer electrode covered with the insulating layer, i.e., a portion on the side face side in the electronic component, whereby no solder fillets are formed in this portion. Hence, even when a plurality of electronic components in accordance with the present invention are mounted closely adjacent to each other, there are no solder fillets between the portions on the side face sides in the electronic components, whereby the problem of short-circuiting by solder bridges does not occur between the electronic components adjacent to each other. Even if a positional deviation occurs when mounting the electronic components of the present invention, so that the portions on the side face sides in the electronic components adjacent to each other come into contact with each other, the insulating layer will prevent the electrodes of the electronic components from short-circuiting therebetween.

The electrode portion may have a sintered electrode layer, the insulating layer may be disposed on the sintered electrode layer, and a portion of the outer electrode not covered with the insulating layer may have a sintered electrode layer and a plating layer disposed thereon.

The insulating layer may be opaque or colored.

In another aspect, the present invention provides a method of manufacturing an electronic component comprising an element body having a pair of end faces opposing each other, a pair of main faces opposing each other while extending so as to connect the pair of end faces to each other, and a pair of side faces opposing each other while extending so as to connect the pair of main faces to each other; and an outer electrode, formed on the end face side of the element body, for covering a part of the main and side faces adjacent to the end face; the method comprising the step of covering at least a surface of an electrode portion of the outer electrode located on the side face side thereof with an insulating layer.

The present invention can manufacture electronic components enabling high-density mounting, in which no solder fillets are formed in portions on the side face sides in the electronic components at the time of mounting, so that no short-circuiting is caused by solder bridges and the like between the electronic components adjacent to each other even when close adjacency mounting is performed as mentioned above.

The outer electrode may be constituted by a sintered electrode layer obtained by sintering a conductive paste and a plating layer, while the insulating layer may be formed by coating with an insulating resin.

The insulating layer may be formed together with the sintered electrode layer by applying a conductive paste to the element body and drying the conductive paste, so as to form a conductive paste layer, then applying a glass paste to the side face of the element body and a portion of the conductive paste layer formed on the side face, so as to form a glass paste layer, and thereafter sintering the conductive paste layer and glass paste layer integrally with each other.

The insulating layer may be formed by applying a conductive paste to the element body and drying and sintering the conductive paste, so as to form a sintered electrode layer, and then applying a glass paste to the side face of the element body and a portion of the electrode layer formed on the side face and sintering the glass paste.

The insulating layer may be formed by applying a conductive paste to the element body and drying and sintering the conductive paste, so as to form a sintered electrode layer, and then applying an insulating resin to the side face of the element body and a portion of the electrode layer formed on the side face and curing the insulating resin.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 17 is a diagram for explaining a cross-sectional structure taken along the line XVII-XVII of FIG. 15; and FIG. 18 is a plan view illustrating another example of mounting the conventional electronic components.

DESCRIPTION OF THE PREFERRED EMBODIMENTS

In the following, preferred embodiments of the present invention will be explained in detail with reference to the accompanying drawings. In the explanation, the same constituents or those having the same functions will be referred to with the same signs while omitting their overlapping descriptions.

Figure 1:
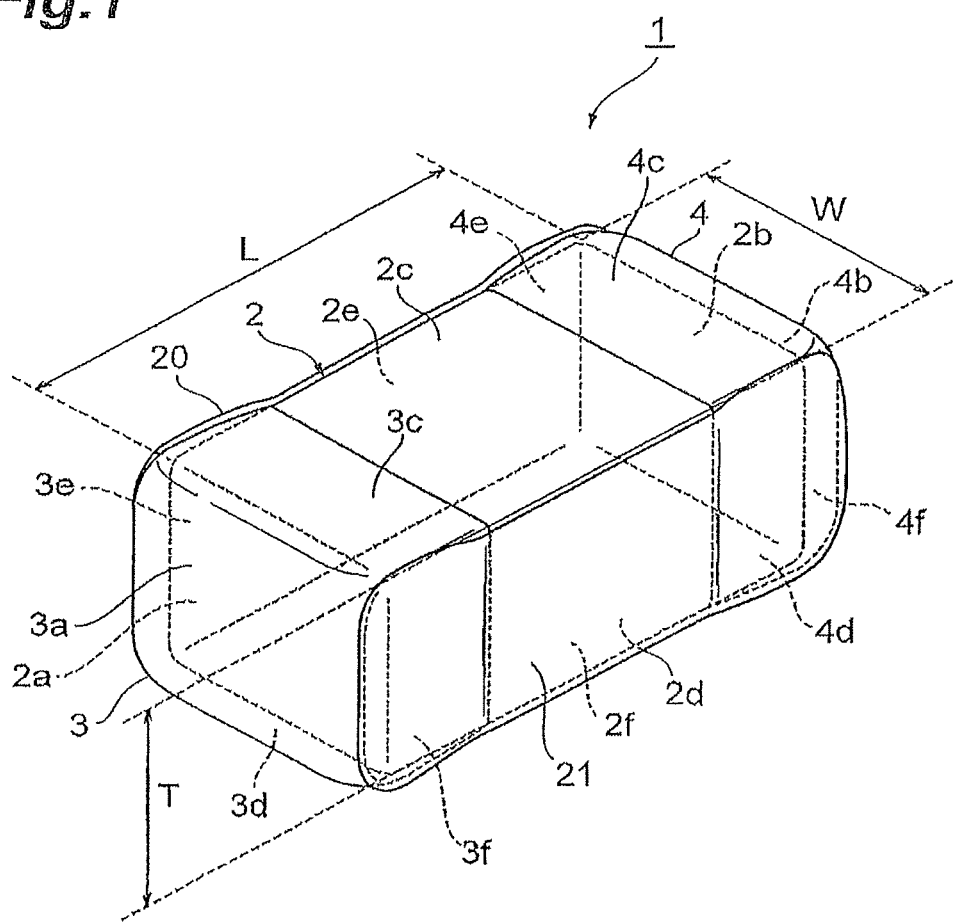
FIG. 1 is a perspective view illustrating the electronic component in accordance with an embodiment.
Figure 2:
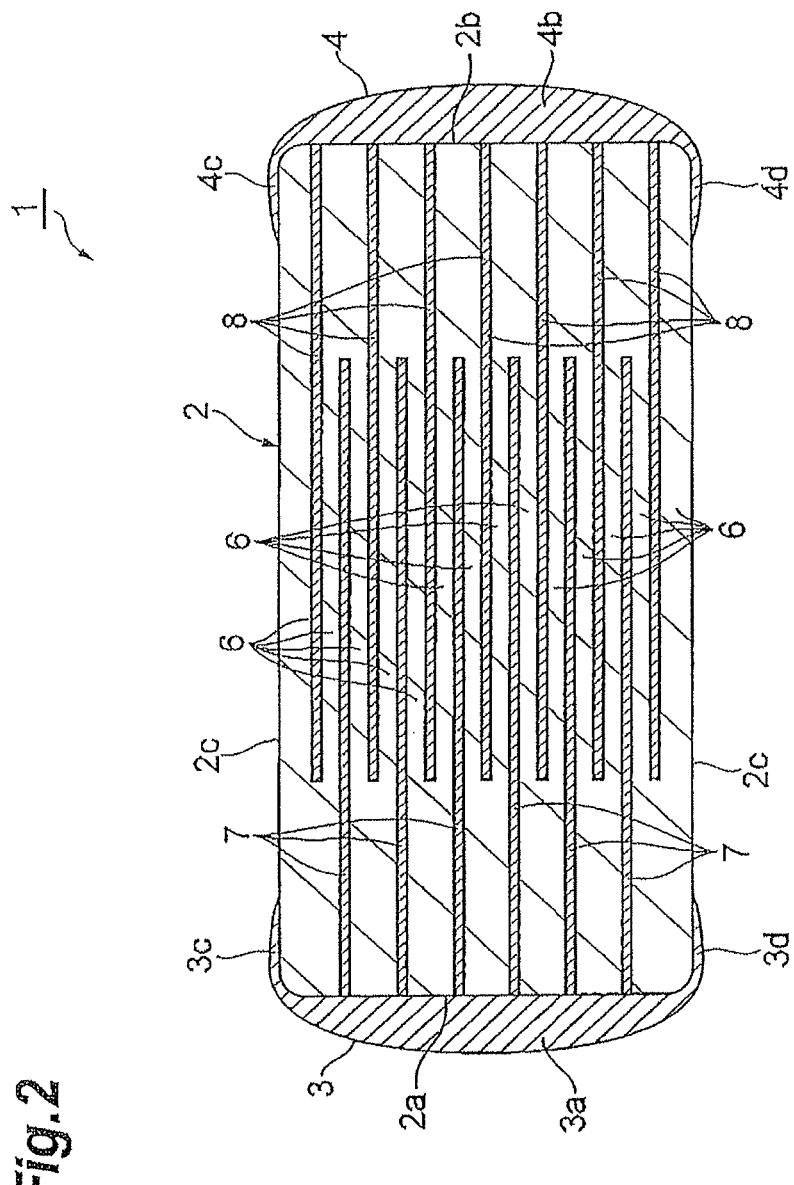
FIG. 2 is a diagram for explaining a cross-sectional structure of the electronic component in accordance with the embodiment.
Figure 3:
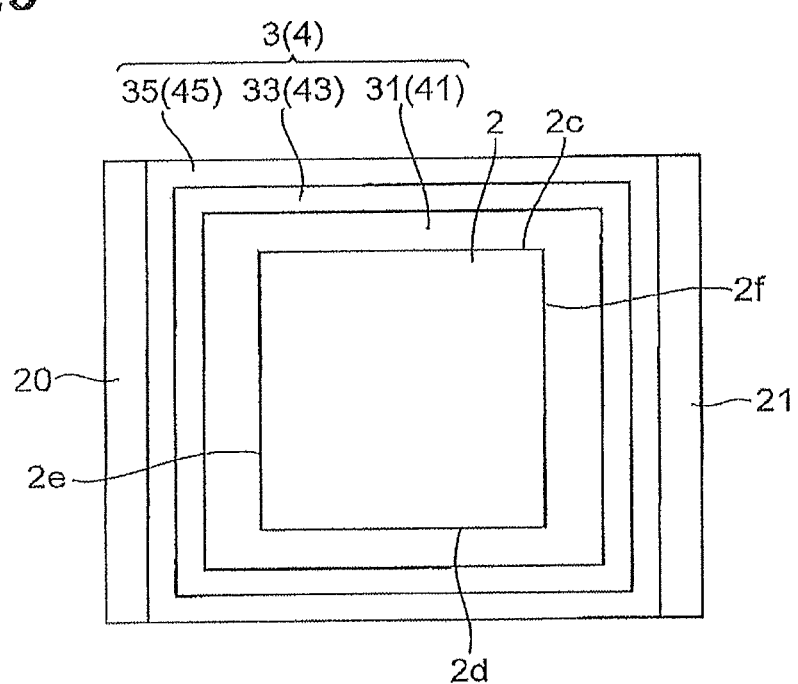
FIG. 3 is a diagram for explaining a cross-sectional structure of the electronic component in accordance with the embodiment.

With reference to FIGS. 1 and 2, structures of an electronic component 1 in accordance with an embodiment will be explained. FIG. 1 is a perspective view illustrating the electronic component in accordance with this embodiment. FIGS. 2 and 3 are diagrams for explaining cross-sectional structures of the electronic component in accordance with the embodiment. FIG. 3 does not depict inner electrodes 7, 8 which will be explained later and the like.

The electronic component 1 is an electronic component such as a multilayer ceramic capacitor, for example. The electronic component 1 comprises an element body 2 and outer electrodes 3, 4. The element body 2 is constructed as a rectangular parallelepiped by stacking and integrating a plurality of ceramic green sheets. As also illustrated in FIG. 1, the element body 2 has a pair of end faces 2a, 2b, a pair of main faces 2c, 2d, and a pair of side faces 2e, 2f. The pair of end faces 2a, 2b are parallel to each other, while opposing each other in the longitudinal direction of the element body 2. The pair of main faces 2c, 2d extend so as to connect the pair of end faces 2a, 2b to each other, while opposing each other. The pair of side faces 2e, 2f extend so as to connect the pair of main faces 2c, 2d to each other, while opposing each other. The outer electrodes 3, 4 are formed on the sides of the end faces 2a, 2b of the element body 2, respectively.

For example, the electronic component 1 is configured such as to have a length (L) of about 0.4 to 1.6 mm, a width (W) of about 0.2 to 0.8 mm, and a height (T) of about 0.4 to 0.8 mm.

As illustrated in FIG. 2, the element body 2 is constructed as a multilayer body in which a plurality of oblong dielectric layers 6 and a plurality of inner electrodes 7, 8 are stacked. The inner electrodes 7, 8 are alternately arranged one by one in the stacking direction of the dielectric layers 6 (hereinafter simply referred to as "stacking direction") in the element body 2. Each pair of inner electrodes 7, 8 are arranged so as to oppose each other while interposing at least one dielectric layer 6 therebetween.

Each dielectric layer 6 is constituted by a sintered body of a ceramic green sheet containing a dielectric ceramic (Ba$TiO_3$, Ba(Ti, Zr)$O_3$, (Ba, Ca)$TiO_3$, or the like), for example. In practice, the dielectric layers 6 are integrated to such an extent that boundaries therebetween are indiscernible in the element body 2.

The inner electrodes 7, 8 contain a conductive material such as Ni or Cu, for example. Each of the inner electrodes 7, 8 has a thickness of about 0.5 to 3 μm, for example. The inner electrodes 7, 8 are not restricted in particular in terms of forms as long as they have regions overlapping each other when seen in the stacking direction. For example, the inner electrodes 7, 8 have rectangular forms. The inner electrodes 7, 8 are constructed as sintered bodies of a conductive paste containing the above-mentioned conductive material. The inner electrodes 7 are connected to the outer electrode 3 electrically and physically, while the inner electrodes 8 are connected to the outer electrode 4 electrically and physically.

The outer electrode 3 is formed such as to cover one end face 2a, a portion of respective edge portions located nearer to the end face 2a in the pair of main faces 2c, 2d, and a portion of respective edge portions located nearer to the end face 2a in the pair of side faces 2e, 2f. The outer electrode 3 has electrode portions 3a, 3c, 3d, 3e, 3f located on their corresponding surfaces 2a, 2c, 2d, 2e, 2f.

The outer electrode 4 is formed such as to cover the other end face 2b, a portion of respective edge portions located nearer to the end face 2b in the pair of main faces 2c, 2d, and a portion of respective edge portions located nearer to the end face 2b in the pair of side faces 2e, 2f. The outer electrode 4 has electrode portions 4b, 4c, 4d, 4e, 4f located on their corresponding surfaces 2b, 2c, 2d, 2e, 2f. The outer electrodes 3, 4 are formed by attaching the conductive paste to the outer surface of the element body 2 by a method which will be explained later, then sintering the conductive paste at a predetermined temperature (e.g., about 700° C.), and thereafter electroplating by a method which will be explained later. Examples of main ingredients of the conductive paste include Cu, Ni, Ag, or Pd. Cu, Ni, Sn, or the like can be used for the electroplating. In this embodiment, the outer electrodes 3, 4 have sintered electrode layers 31, 41, Ni plating layers 33, 43, and Sn plating layers 35, 45.

As illustrated in FIGS. 1 and 3, an insulating layer 20 is formed such as to cover the side face 2e of the element body 2 and the electrode portions 3e, 4e located on the side face 2e side. Similarly, as illustrated in FIGS. 1 and 3, an insulating layer 21 is formed such as to cover the side face 2f of the element body 2 and the electrode portions 3f, 4f located on the side face 2f side.

Figure 4:
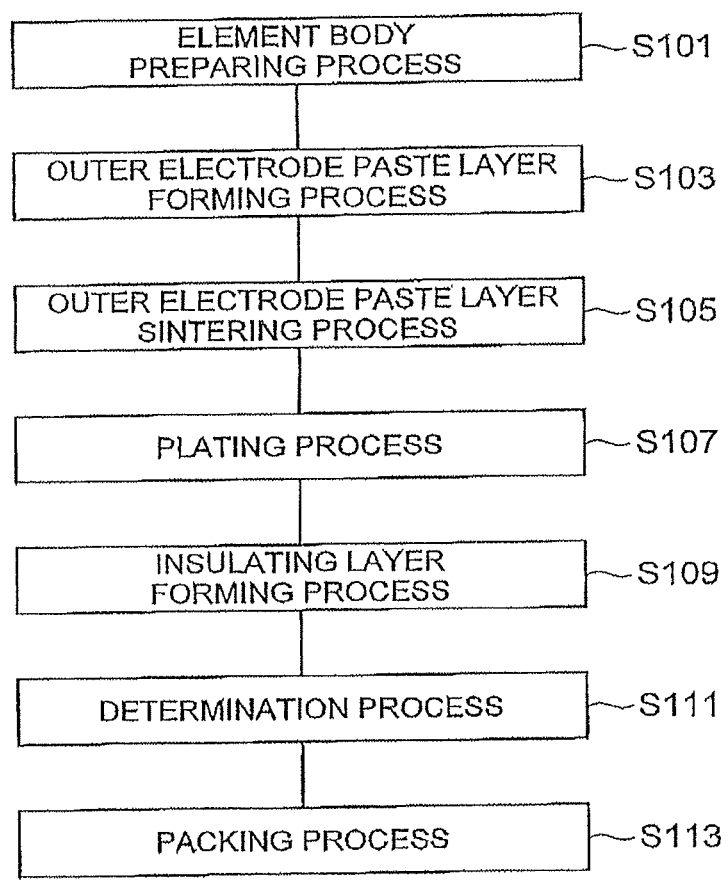
FIG. 4 is a flowchart illustrating a method of manufacturing the electronic component in accordance with the embodiment.

In the following, a method of manufacturing the electronic component 1 in accordance with this embodiment will be explained with reference to FIG. 4. FIG. 4 is a flowchart illustrating the method of manufacturing the electronic component in accordance with this embodiment.

Element Body Preparing Process

The manufacturing of the electronic component 1 begins with an element body preparing process (S101). The element body preparing process forms ceramic green sheets to become the dielectric layers 6, then prints patterns to become the inner electrodes 7, 8 on their corresponding ceramic green sheets with the conductive paste, and thereafter dries the conductive paste. This forms the electrode patterns on the ceramic green sheets. A plurality of ceramic green sheets formed with the electrode patterns are stacked, so as to form a multilayer body of ceramic green sheets. The multilayer body of ceramic green sheets is cut into chips each having a size corresponding to that of the element body 2. Subsequently, water, a plurality of chips, and polishing media are put into a hermetically-closable rotary pot made of polyethylene or the like, and the rotary pot is closed and rotated, so as to chamfer corner portions of the chips. The chamfered chips are heat-treated at a predetermined temperature for a predetermined time, so as to be debindered. After the debindering, firing is performed, so as to yield the element body 2.

Outer Electrode Paste Layer Forming Process

Next, an outer electrode paste layer forming process (S103) is performed. The outer electrode paste layer forming process can be achieved by a known technique for dipping into the conductive paste. Specifically, a known holding jig such as a carrier plate is used so as to hold the main faces 2c, 2d of the element body 2 on the other end face 2b side such that one end face 2a faces up. Subsequently, a first paste layer is formed on the end face 2a side of the element body 2. Here, the end face 2a of the element body 2 held by the holding jig is initially dipped into the conductive paste disposed on a coating bed, whereby the conductive paste is applied to the end face 2a side of the element body 2. Thereafter, the applied conductive paste is dried, so as to form the first paste layer. Appropriately setting the depth by which the element body 2 is dipped into the conductive paste forms the first paste layer corresponding to the five electrode portions 3a, 3c, 3d, 3e, 3f. After drying the first paste layer, a second paste layer corresponding to the five electrode portions 4b, 4c, 4d, 4e, 4f is formed on the end face 2b side of the element body 2 by a similar process.

Outer Electrode Paste Layer Sintering Process

After being formed, the first and second paste layers are heat-treated at 780° C., for example, so as to form the sintered electrode layers 31, 41 as illustrated in FIG. 3 (S105).

Plating Process

After forming the sintered electrode layers 31, 41, a plating process (S107) is performed. The plating process forms the Ni plating layers 33, 43 and Sn plating layers 35, 45 on the surfaces of the sintered electrode layers 31, 41. For example, a barrel plating apparatus can be used in the plating process. The element body 2 formed with the sintered electrode layers 31, 41 is immersed into a plating liquid within the barrel, which is then rotated, so as to form the plating layers on the surfaces of the sintered electrode layers 31, 41. The outer electrodes 3, 4 have a composite structure constituted by the sintered electrode layers 31, 41, Ni plating layers 33, 43, and Sn plating layers 35, 45.

Insulating Layer Forming Process

After completing the plating process, the insulating layers 20, 21 are formed (S109). The insulating layers 20, 21 are formed by coating the side faces 2e, 2f of the element body 2 having the plating layers 33, 43, 35, 45 formed thereon and the electrode portions 3e, 3f, 4e, 4f with an insulating material (e.g., an insulating glass material or insulating resin material). The insulating layers 20, 21 completely cover at least the surfaces of the electrode portions 3e, 3f, 4e, 4f of the outer electrodes 3, 4. Since the insulating layers 20, 21 coat the outer electrodes 3, 4 having the plating layers 33, 43, 35, 45 formed thereon, it is preferred for them to cause no damage (such as melting or oxidization) to the plating layers under the load of the coating process, be formable by treating at low temperature, and have resistance to the heat of soldering at the time of mounting the electronic component. Examples of the insulating layers 20, 21 include insulating resin layers and glass layers.

The temperature in the low-temperature treatment is 200° C. or lower, preferably 160° C. or lower. Specific examples of the insulating resins include heat-resistant resin coating materials such as thermosetting epoxy resin coating material using metal oxide pigments employable as solder resists for printed boards, silicone resin coating materials using metal oxide pigments employable as heat-resistant coating materials, fluorinated coating materials, phenolic resin coating materials, urea resin coating materials, melamine resin coating materials, unsaturated polyester resin coating materials, or diallyl phthalate resin coating materials.

Preferably, the heat-resistant resin coating materials are doped with an organic or inorganic pigment as appropriate, so as to color or opaque the insulating layers. Examples of the coloring organic pigments include phthalocyanine pigment or anthraquinone pigment, while an example of the inorganic pigments is carbon black. A pigment having high refractive index may be used as a metal oxide pigment, so as to provide the insulating layers 20, 21 with an appropriate light-scattering property as substantial opaqueness.

The coating with the insulating material can be performed as follows by using a known method. First, the insulating material is applied to the side face 2e of the element body 2 and the electrode portions 3e, 4e so as not to be traveled to the end faces 2a, 2b and main faces 2c, 2d of the element body 2 and the electrode portions 3a, 3b, 3c, 3d, 4a, 4b, 4c, 4d and then is dried. Thereafter, the element body 2 is reversed, so as to apply the insulating material similarly to the side face 2f and the electrode portions 3f, 4f.

Preferably, screen printing is employed as the coating method. The screen printing can apply the insulating material so as not to travel it to the end faces 2a, 2b and main faces 2c, 2d of the element body 2 and the electrode portions 3a, 3b, 3c, 3d, 4a, 4b, 4c, 4d. Adhesive holding media may be used as member for holding the element body 2. In this case, the insulating layer 20 is formed on the side face 2e and the electrode portions 3e, 4e while the element body 2 is held by an adhesive holding medium, and then the element body 2 is transferred to another adhesive holding medium. This can easily reverse the element body 2, so as to form the insulating layer 21 on the side face 2f and the electrode portions 3f, 4f. Here, the insulating layers 20, 21 are constituted by insulating resin layers.

The foregoing processes yield the electronic component 1. Materials, forming methods, and the like for the insulating layers 20, 21 are not limited to those mentioned above. For example, insulating layers made of $SiO_2$ and the like may be formed as the insulating layers 20, 21 by high-frequency sputtering or vacuum vapor deposition.

Determination Process

Subsequently, at a determination process (S111), the difference in color is determined between the main faces 2c, 2d and the side faces 2e, 2f formed with the insulating layers 20, 21. For example, a colorimeter can be a spectral color difference meter (spectrophotometer). This spectrophotometer is used to measure the luminance values L in the CIE (Commission Internationale d'Eclairage) 1976 L*a*b* (CIELAB) (JIS Z8729). The spectrophotometer can mechanically distinguish the side faces 2e, 2f formed with the insulating layers 20, 21 from the main faces 2c, 2d without the insulating layers 20, 21.

Packing Process

Figure 5:
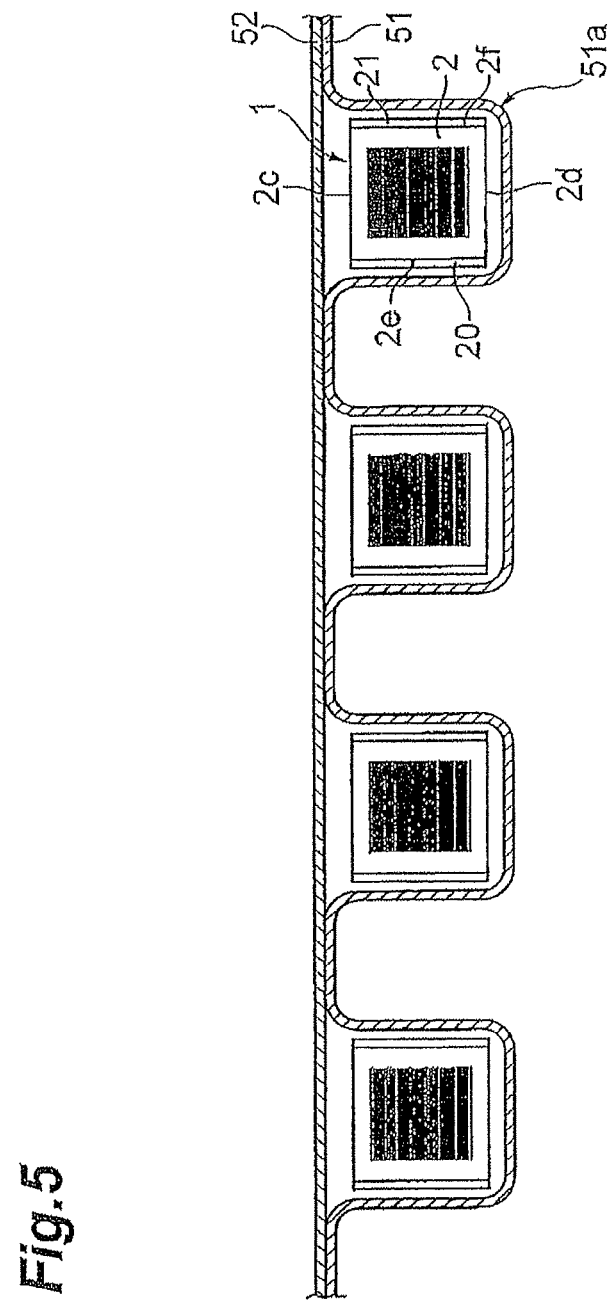
FIG. 5 is a sectional view illustrating a state of packing the electronic component in accordance with the embodiment.

Next, as illustrated in FIG. 5, a plurality of electronic components 1 are arranged such that the determined side faces 2e, 2f are oriented in the same direction and packed into a packing material at a packing process (S113). The packing material is constituted by packing members 51, 52. The packing member 51 is formed with a plurality of depressions 51a, each having a quadrangular cross section, arranged two-dimensionally. The depressions 51a accommodate the respective electronic components 1. Each electronic component 1 is accommodated in its corresponding depression 51a such that the side faces 2e, 2f formed with the insulating layers 20, 21 are perpendicular to the depth direction of the depression 51a. Thereafter, the packing member 52 covers the openings of the depressions 51a. This completes the packing of the electronic components 1.

Figure 6:
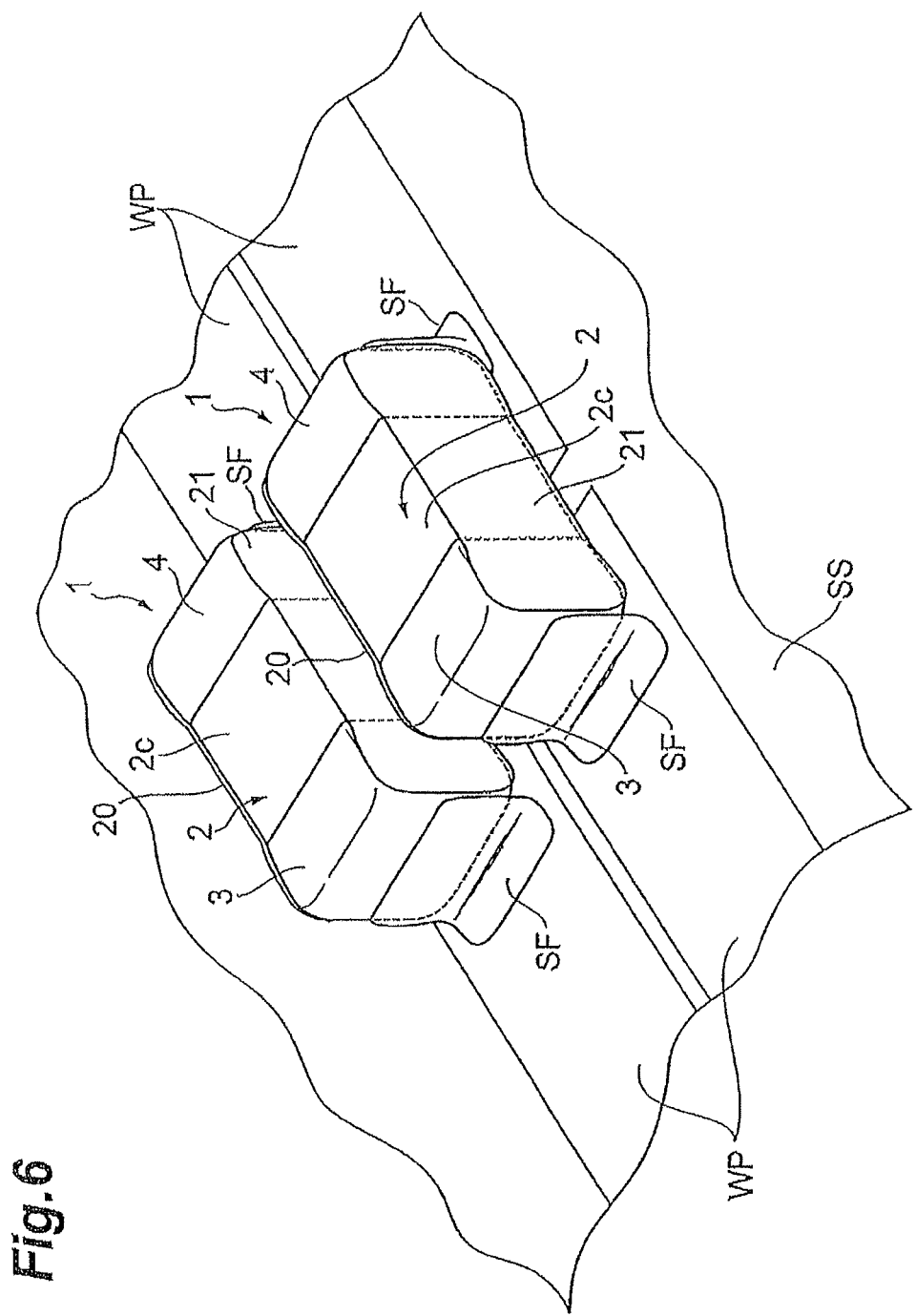
FIG. 6 is a perspective view illustrating an example of mounting the electronic component in accordance with the embodiment.
Figure 7:
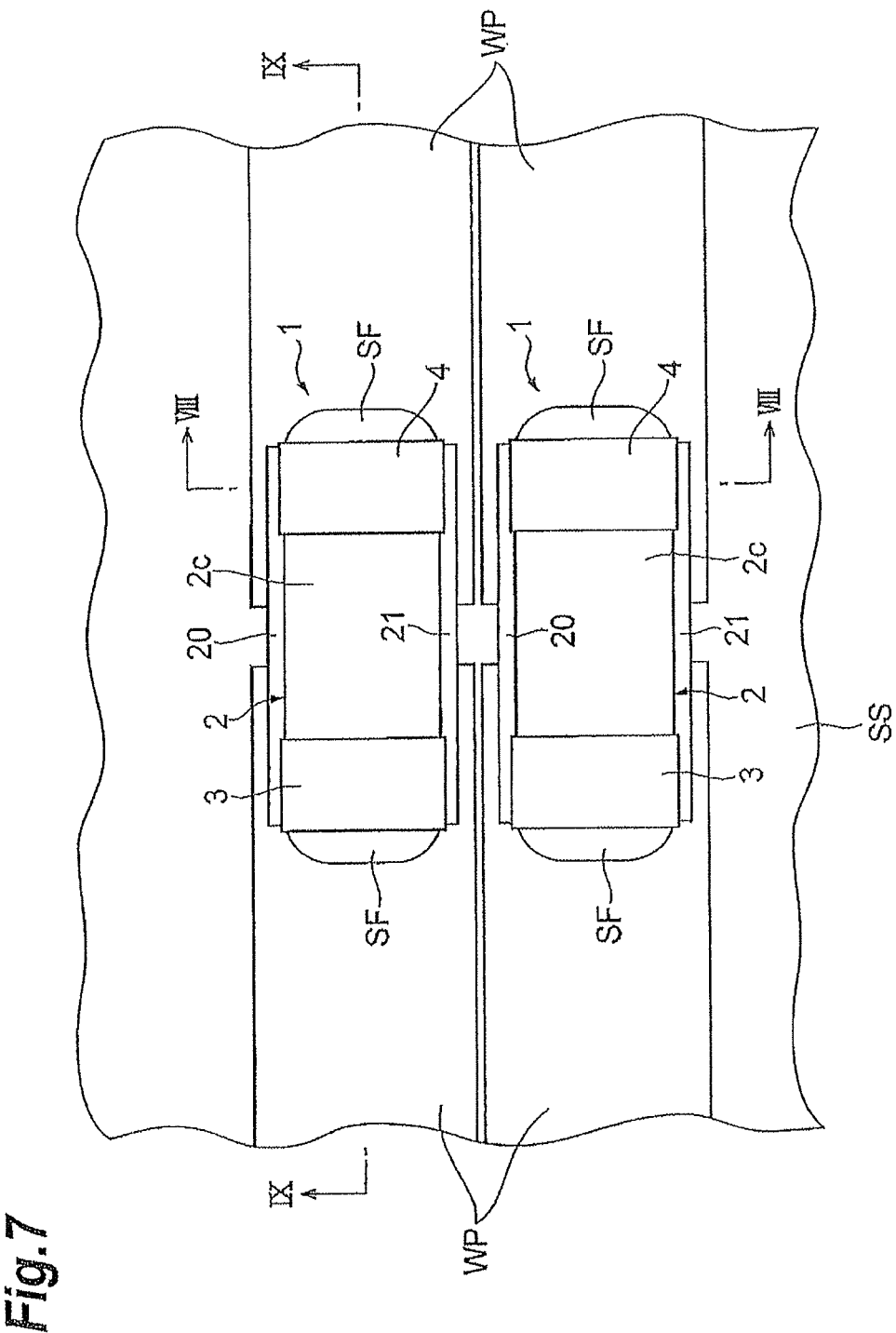
FIG. 7 is a plan view illustrating the example of mounting the electronic component in accordance with the embodiment.
Figure 8:
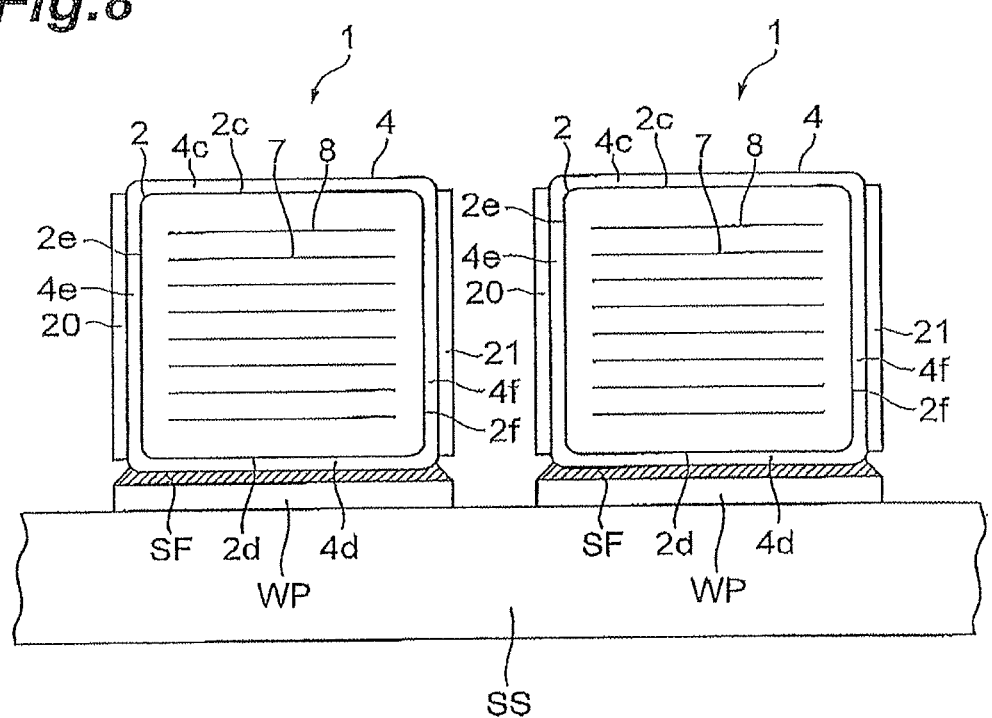
FIG. 8 is a diagram for explaining a cross-sectional structure taken along the line VIII-VIII of FIG. 7.
Figure 9:
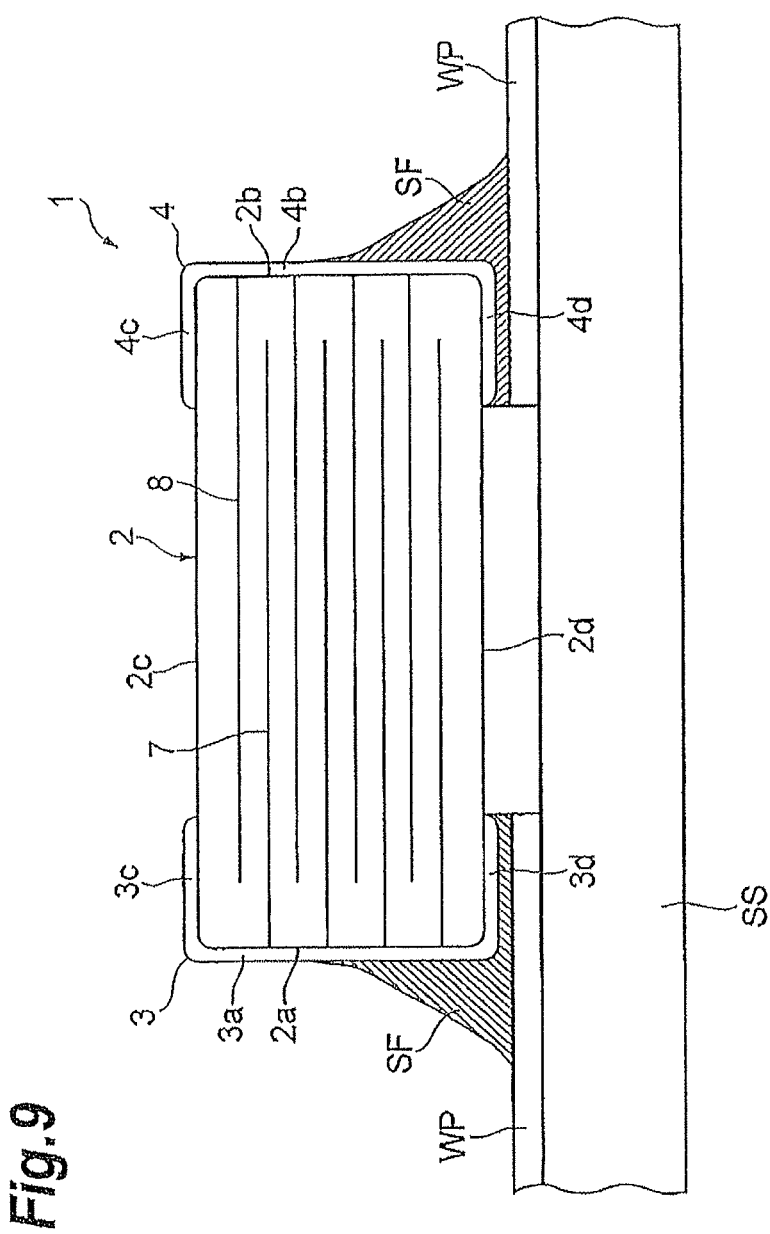
FIG. 9 is a diagram for explaining a cross-sectional structure taken along the line IX-IX of FIG. 7.
Figure 10:
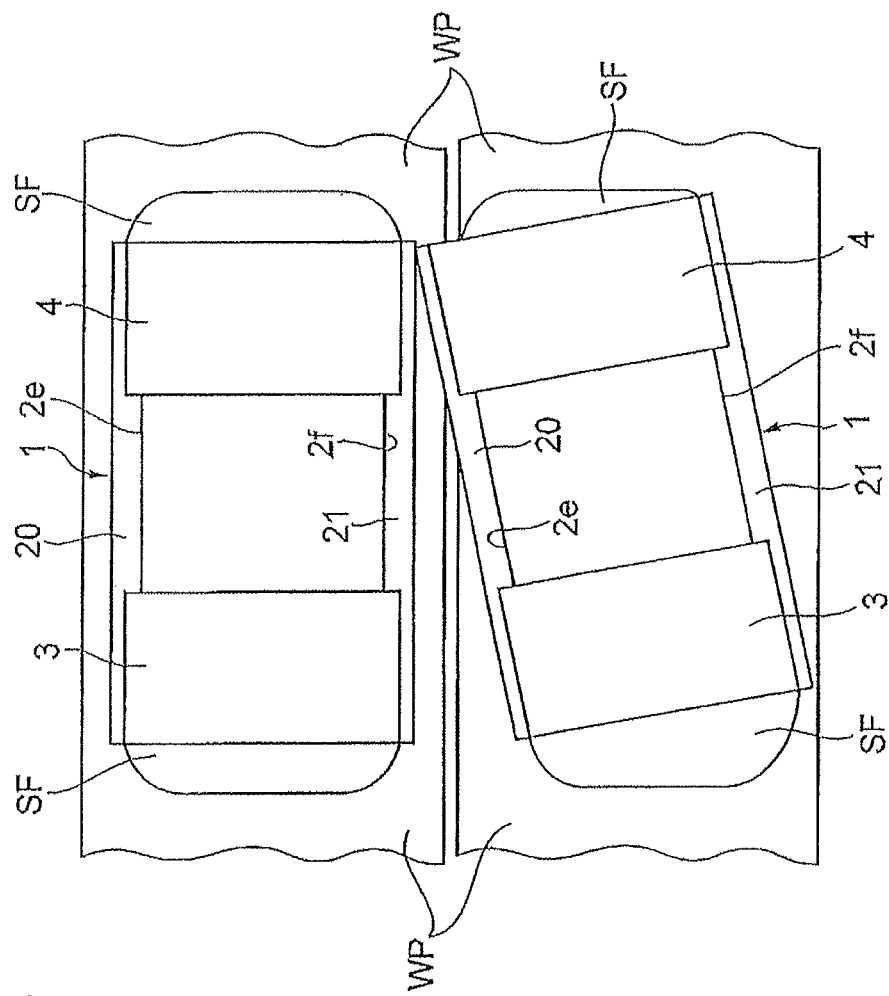
FIG. 10 is a plan view illustrating another example of mounting the electronic component in accordance with the embodiment.

With reference to FIGS. 6 to 10, examples of mounting the electronic component 1 will now be explained. FIG. 6 is a perspective view illustrating an example of mounting the electronic component in accordance with this embodiment. FIGS. 7 and 10 are plan views illustrating examples of mounting the electronic component in accordance with this embodiment. FIG. 8 is a diagram for explaining a cross-sectional structure taken along the line VIII-VIII of FIG. 7. FIG. 9 is a diagram for explaining a cross-sectional structure taken along the line IX-IX of FIG. 7. FIGS. 8 and 9 hatch only solder fillets SF which will be explained later.

The electronic component 1 is taken out of the packing material (packing members 51, 52) illustrated in FIG. 5, so as to be mounted on a substrate. The packed electronic component 1 is taken out of the packing material by a suction head of a surface mounter. Here, a suction nozzle abuts against the main face 2c or 2d, since the electronic component 1 is packed such that the side faces 2e, 2f formed with the insulating layers 20, 21 are perpendicular to the depth direction of the depression 51a at the packing process (S113). This makes it unnecessary to align the mounting direction of the electronic components 1 at the time of mounting.

When mounting the electronic component 1, the outer electrodes 3, 4 are connected to a wiring pattern WP of a substrate SS by solder reflow. Therefore, as illustrated in FIGS. 6 to 10, the electronic component 1 is mounted by soldering. As the solder, those in conformity to ISO/FDIS 9453:2006 (JIS Z 3282), such as Sn—Sb, can be used without wetting the above-mentioned insulating resins.

The electronic component 1 is arranged in such a direction that the pair of side faces 2e, 2f formed with the insulating layers 20, 21 are perpendicular to the substrate SS. Therefore, when soldering is performed, no solder fillets SF are formed on the sides of the side faces 2e, 2f of the element body 2. This can yield margins toward the side faces 2e, 2f, thereby raising the mounting density.

The electronic component 1 is mounted on a printed board or the like while the main face 2c or 2d faces up. Since the insulating layers 20, 21 are formed on the electrode portions 3e, 3f, 4e, 4f located on the sides of the side faces 2e, 2f, no solder fillets SF are formed on the sides of the side faces 2e, 2f as illustrated in FIGS. 6 to 8. Since there are the insulating layers 20, 21, the problem of electric short-circuiting will not occur between the electronic components 1 even if their mounting positions deviate such that a portion of one electronic component 1 on any of the sides of the side faces 2e, 2f comes into contact with its adjacent electronic component 1 as illustrated in FIG. 10. These can attain the electronic component 1 enabling high-density mounting.

In this embodiment, the insulating layers 20, 21 are formed after forming the plating layers (Ni plating layers 33, 43, Sn plating layers 35, 45, and the like). This can prevent the plating layers from being thermally damaged when forming the insulating layers 20, 21 made of insulating resins.

Meanwhile, electronic components of a surface mounting type in general are supplied in the form of a taping package accommodating individual components in pockets of a carrier tape by a taping apparatus. The taping-packaged electronic components are picked up from the pockets of the carrier tape by the suction head of the surface mounter, so as to be mounted on the mounting substrate. The mounting direction of the electronic component at the time of mounting is determined by the direction in which the electronic component is accommodated in the pocket of the carrier tape.

The electronic component 1 of this embodiment is mounted on the substrate SS while aligning its direction such that the side faces 2e, 2f formed with the insulating layers 20, 21 are perpendicular to the mounting surface of the substrate SS. As a consequence, the insulating layers 20, 21 can fully exhibit their operational effects, thereby achieving close adjacent high-density mounting. This makes it necessary for the electronic component 1 to be accommodated in each pocket of the carrier tape such that the side faces 2e, 2f formed with the insulating layers 20, 21 are aligned.

For aligning the electronic components 1, it is necessary to sort out misaligned components (electronic components 1) by optically inspecting their appearances with a camera or spectrophotometer. Since the insulating layers 20, 21 are optically opaque or colored, the alignment can be performed highly accurately at high speed. The insulating layers 20, 21 may be optically opaque or colored to such an extent that whether there are the insulating layers 20, 21 or not is discernible, while the colors of the electrode portions 3e, 3f, 4e, 4f or side faces 2e, 2f formed with the insulating layers 20, 21 may not be hidden completely.

Figure 11:
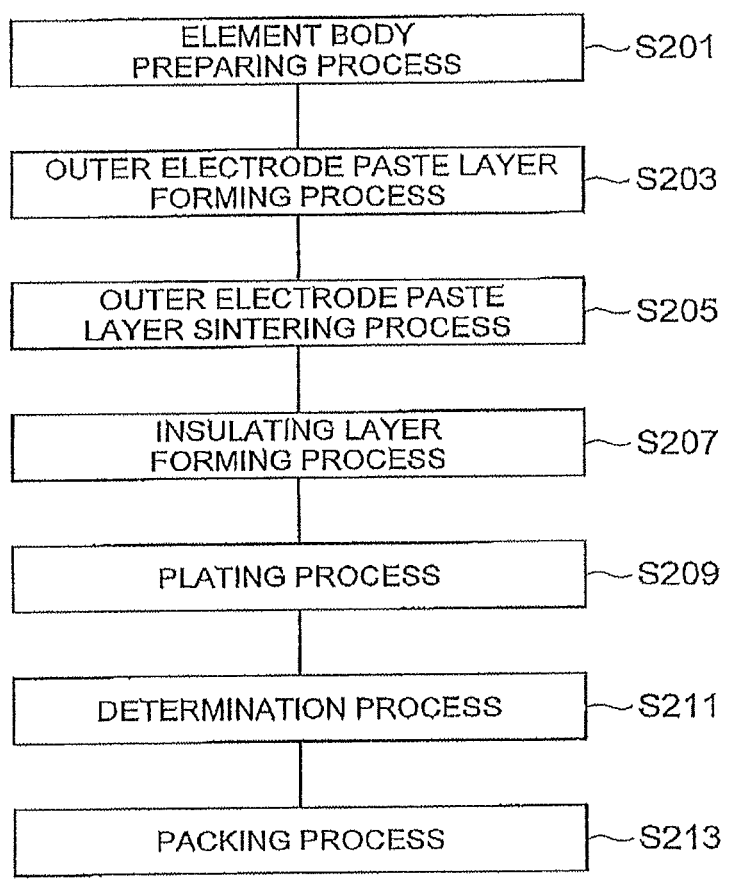
FIG. 11 is a flowchart illustrating a method of manufacturing an electronic component in accordance with a modified example of the embodiment.

With reference to FIG. 11, a method of manufacturing the electronic component 1 in accordance with a modified example of this embodiment will be explained. FIG. 11 is a flowchart illustrating a method of manufacturing an electronic component in accordance with the modified example of the embodiment.

In this modified example, the element body 2 is formed at an element body preparing process (S201) as in the above-mentioned embodiment. Subsequently, an outer electrode paste layer forming process (S203) and an outer electrode paste layer sintering process (S205) are performed, so as to form the sintered electrode layers 31, 41.

Figure 12:
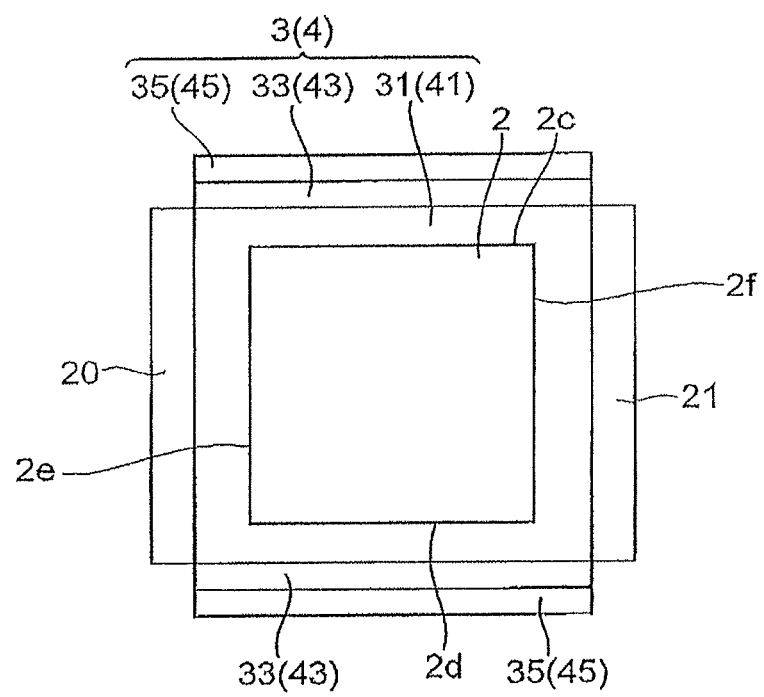
FIG. 12 is a diagram for explaining a cross-sectional structure of the electronic component in accordance with the modified example of the embodiment.

After forming the sintered electrode layers 31, 41, an insulating layer forming process (S207) is performed. Here, the side faces 2e, 2f of the element body 2 and the portions of the electrode layers 31, 41 formed on the side faces 2e, 2f are coated with an insulating material (e.g., an insulating glass material or insulating resin material), so as to form the insulating layers 20, 21. The insulating layers 20, 21 completely cover at least the surfaces of the portions of the sintered electrode layers 31, 41 formed on the side faces 2e, 2f. This forms the sintered electrode layers 31, 41 and insulating layers 20, 21 as illustrated in FIG. 12. FIG. 12 does not depict the inner electrodes 7, 8 and the like.

The insulating layers 20, 21 may be those having corrosion resistance to the plating liquid, such a strength that problems of peeling and the like do not occur when using barrel plating in particular, and resistance to the heat of soldering at the time of mounting the electronic component 1. Specific examples of usable insulating resins include thermosetting epoxy resin coating material using metal oxide pigments employable as solder resists for printed boards, silicone resin coating materials using metal oxide pigments employable as heat-resistant coating materials, fluorinated coating materials, phenolic resin coating materials, urea resin coating materials, melamine resin coating materials, unsaturated polyester resin coating materials, or diallyl phthalate resin coating materials as in the above-mentioned embodiment. The insulating layers 20, 21 may be formed by any of techniques similar to those in the above-mentioned embodiment.

The insulating layers 20, 21 may also be insulating glass layers. The insulating glass layers can be obtained by applying a glass paste constituted by a glass composition having corrosion resistance to the plating liquid, so as to form a glass paste layer, and then sintering the glass paste layer. When the insulating layers 20, 21 are formed by the sintered layers of the glass paste layer, they are less likely to be damaged by a washing solvent at the time of flux washing with a thinner or the like after the electronic component 1 is mounted by soldering to a substrate than in the case of using the above-mentioned heat-resistant resin coating materials. Therefore, the electronic component 1 with higher reliability can be attained.

Preferred as the glass paste are low-melting glass compositions which can be sintered at a temperature not higher than that at the time of sintering the sintered electrode layers 31, 41. Examples of glass materials used in a glass frit contained in the glass paste include Sr—Al—Si—B—O-based glass, Ba—Al—Si—B—O-based glass, or Si—Ba—Li—O-based glass. When these glass materials are used as the glass frit, the glass paste can be sintered at a sintering temperature of 800° C. to 700° C. or lower, so as to form the insulating layers 20, 21. The glass paste may contain other inorganic fillers or have a crystallized glass composition.

The glass paste containing a coloring inorganic filler can color the insulating layers 20, 21. The glass paste containing inorganic fillers exhibiting refractive indexes different from each other or the glass paste having the crystallized glass composition can make the insulating layers 20, 21 optically uneven, thereby providing them with a light-scattering property. As a result, the insulating layers 20, 21 can substantially have optical opaqueness.

After forming the insulating layers 20, 21, a plating process (S209) is performed. In this modified example, the insulating layers 20, 21 are formed on the side faces 2e, 2f of the element body 2 not formed with the plating layers yet and the portions of the sintered electrode layers 31, 41 formed on the side faces 2e, 2f. Therefore, the plating layers (Ni plating layers 33, 43, Sn plating layers 35, 45, and the like) are formed only on the surfaces of the portions formed on the end faces 2a, 2b and main faces 2c, 2d (the portions not covered with the insulating layers 20, 21) in the sintered electrode layers 31, 41.

When the sintered electrode layers 31, 41 are made of a conductive material (e.g., a Cu-based metal composition) having a tint different from that of the plating layers, for example, the color (electrode color) of the portions of the sintered electrode layers 31, 41 formed on the side faces 2e, 2f can be made different from that of the surfaces of the electrode portions 3c, 3d, 4c, 4d in the outer electrodes 3, 4 having the plating layers. In this case, even when the insulating layers 20, 21 are neither opaque nor colored, the orientation of the electronic component 1 can be identified optically.

Thereafter, a determination process (S211) and a packing process (S213) are performed as in the above-mentioned embodiment.

The electronic component 1 in this modified example is mounted to a printed board or the like while the main face 2c or 2d faces up. Since only the electrode portions 3a, 3b, 3c, 3d, 4a, 4b, 4c, 4d of the outer electrodes 3, 4 are wettable by solder and conductive, the electronic component 1 enabling high-density mounting can be attained as in the above-mentioned embodiment. The insulating layers 20, 21 are directly formed on the sintered electrode layers 31, 41, which are more heat-resistant than the plating layers, and thus have higher mechanical and thermal strengths than in the above-mentioned embodiment. Therefore, even when the electronic component 1 is soldered at higher temperature so as to be mounted to the substrate, the insulating layers 20, 21 are not damaged, whereby the highly reliable electronic component 1 can be attained.

In this modified example, the insulating layers 20, 21 are made of glass layers. That is, the insulating layers 20, 21 are formed by using an insulating glass paste. Therefore, as compared with insulating layers made of insulating resins, the insulating layers 20, 21 can be made more mechanically strong and electrically insulating.

After forming the insulating layers 20, 21, the plating layers are formed by electroplating or the like. As a consequence, the outer electrodes 3, 4 are constructed such that the plating layers are formed on the portions of the sintered electrode layers 31, 41 not covered with the insulating layers 20, 21.

Figure 13:
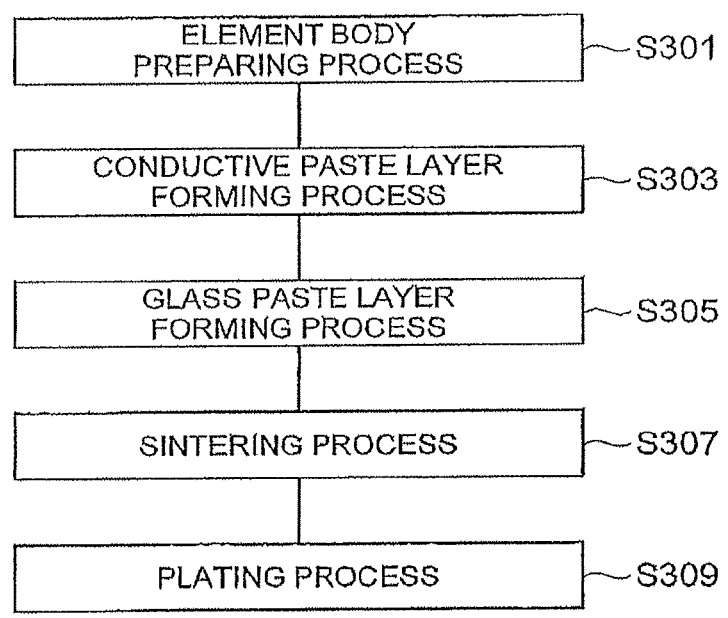
FIG. 13 is a flowchart illustrating a method of manufacturing an electronic component in accordance with another modified example of the embodiment.
Figure 14:
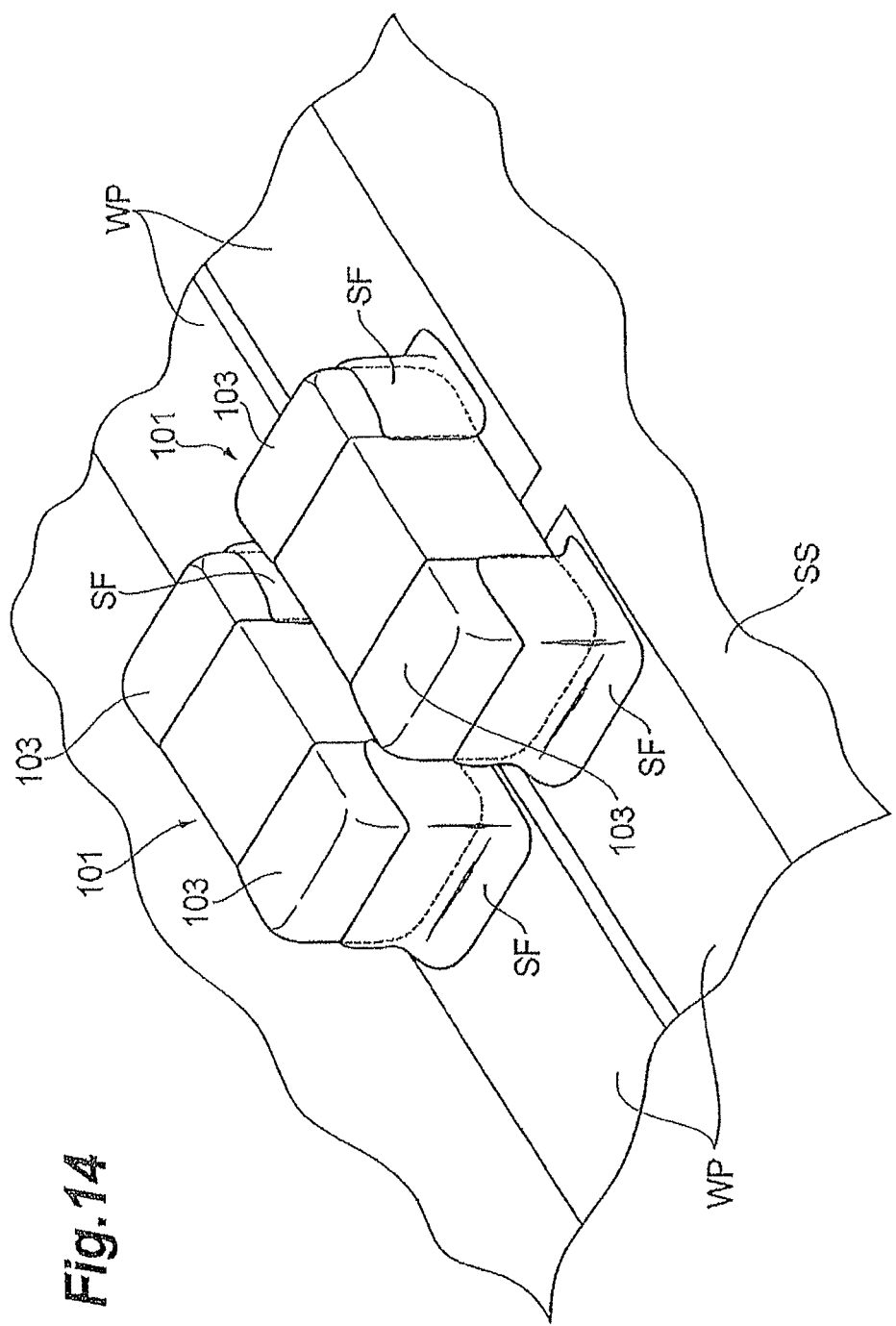
FIG. 14 is a perspective view illustrating an example of mounting conventional electronic components.
Figure 15:
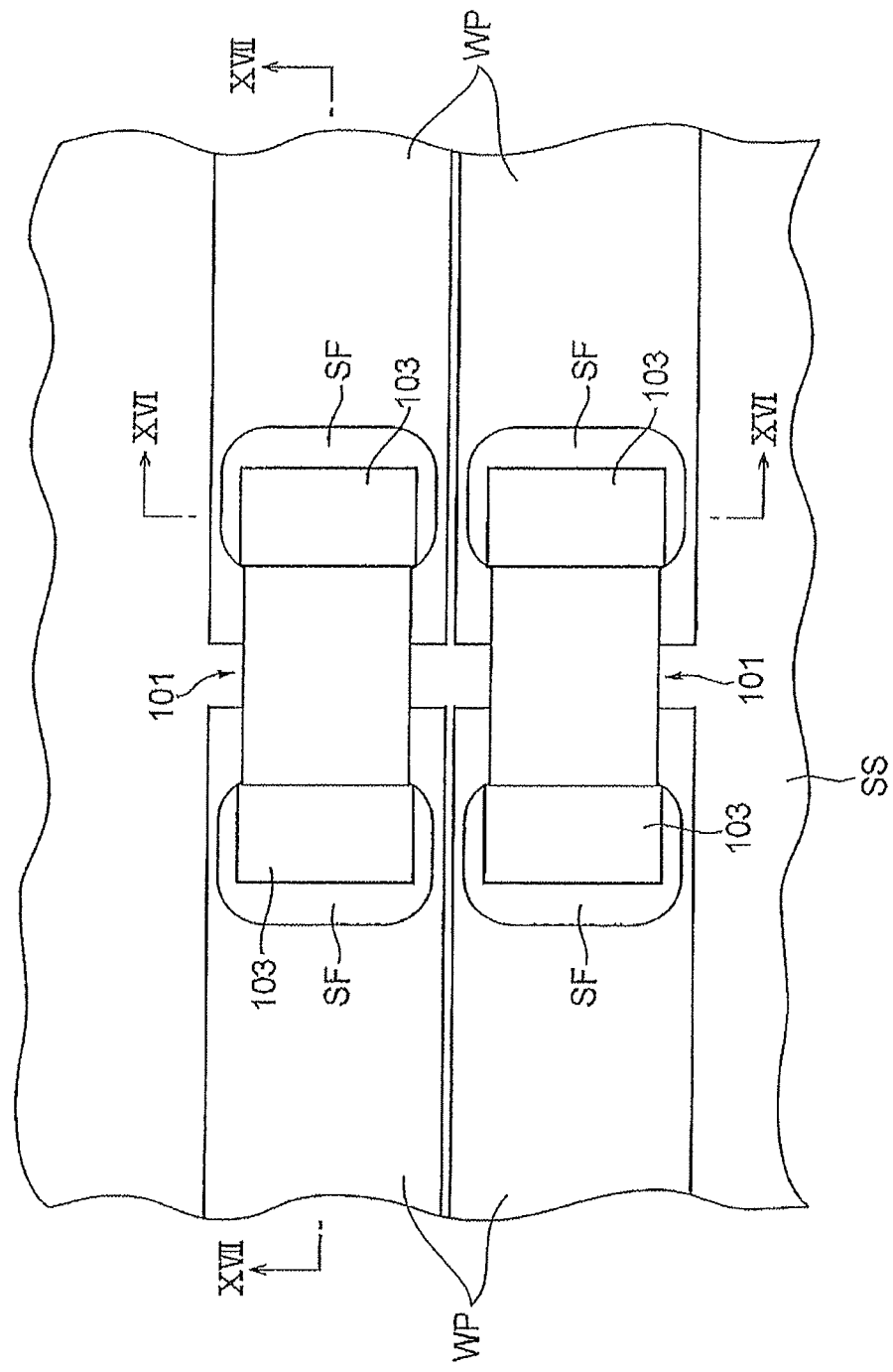
FIG. 15 is a plan view illustrating the example of mounting the conventional electronic components.
Figure 16:
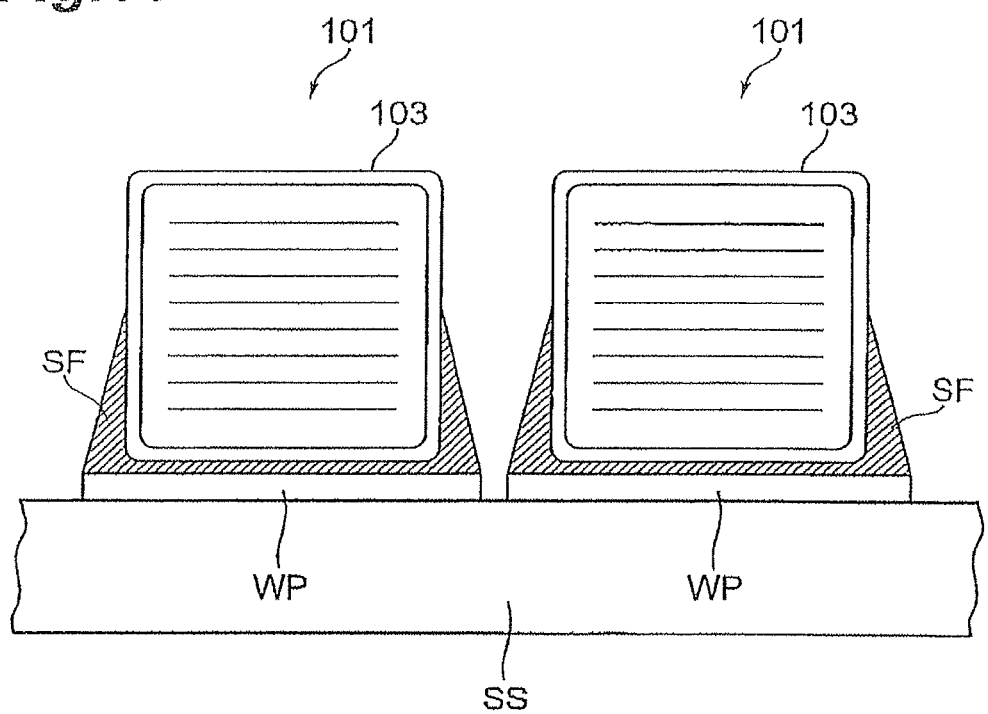
FIG. 16 is a diagram for explaining a cross-sectional structure taken along the line XVI-XVI of FIG. 15.

Next, with reference to FIGS. 12 and 13, a method of manufacturing the electronic component 1 in accordance with another modified example of the embodiment will be explained. FIG. 13 is a flowchart illustrating a method of manufacturing an electronic component in accordance with this modified example of the embodiment.

First, in this embodiment, the element body 2 is formed at an element body preparing process (S301) as in the above-mentioned embodiment.

Next, a conductive paste layer forming process (S303) is performed. The conductive paste layer forming process can use a known technique by which the element body 2 is dipped into a conductive paste. Specifically, after completing the element body 2, a known holding jig such as a carrier plate is used so as to hold the main faces 2c, 2d of the element body 2 on the other end face 2b side such that one end face 2a faces up. Subsequently, the end face 2a of the element body 2 held by the holding jig is dipped into the conductive paste disposed on a coating bed, whereby the conductive paste is applied to the end face 2a side of the element body 2. Thereafter, the applied conductive paste is dried, so as to form a first conductive paste layer. Here, appropriately setting the depth by which the element body 2 is dipped into the conductive paste forms the first conductive paste layer on five surfaces 2a, 2c, 2d, 2e, 2f of the element body 2. After forming the first conductive paste layer, a similar process is performed on the end face 2b side of the element body 2, so as to form a second conductive paste layer on five surfaces 2b, 2c, 2d, 2e, 2f of the element body 2.

Then, a glass paste layer forming process (S305) is performed. After forming the first and second conductive paste layers, the glass paste layer forming process forms a glass paste layer on the side faces 2e, 2f of the element body 2 and the portions of the first and second conductive paste layers formed on the side faces 2e, 2f. Here, a glass paste made of a glass composition having corrosion resistance to a plating liquid is used, so as to be applied to the side faces 2e, 2f of the element body 2 and the portions of the first and second conductive paste layers formed on the side faces 2e, 2f. The glass paste layer completely covers at least the portions of the first and second conductive paste layers formed on the side faces 2e, 2f.

Preferred as the glass paste are low-melting glass compositions which can be sintered at a temperature slightly lower than the sintering temperature of the first and second conductive paste layers so as to be sintered simultaneously with the first and second conductive paste layers. For example, the glass frit composition employed in the above-mentioned conductive paste is preferably used as a composition of the glass frit contained in the glass paste. This does not restrict the glass frit composition, examples of which also include Sr—Al—Si—B—O-based glass, Ba—Al—Si—B—O-based glass, or Si—Ba—Li—O-based glass. In this case, controlling the glass composition ratio allows the glass frit to have such a melting point that it can be sintered together with the first and second conductive paste layers. The glass paste may contain other inorganic fillers or have a crystallized glass composition.

Next, a sintering process (S307) is carried out. After forming the glass paste layer, the sintering process performs heat treatment at 780° C., for example, so as to sinter the first and second conductive paste layers and the glass paste layer at the same time. This forms the sintered electrode layers 31, 41 and the insulating layers 20, 21 as illustrated in FIG. 12.

After forming the insulating layers 20, 21, a plating process (S309) is performed. The insulating layers 20, 21 are formed on the side faces 2e, 2f of the element body 2 not formed with the plating layers yet and the portions of the sintered electrode layers 31, 41 formed on the side faces 2e, 2f in this modified example too. Therefore, the plating layers (Ni plating layers 33, 43, Sn plating layers 35, 45, and the like) are formed only on the surfaces of the portions formed on the end faces 2a, 2b and main faces 2c, 2d (the portions not covered with the insulating layers 20, 21) in the sintered electrode layers 31, 41.

Thereafter, determination and packing processes, which are not depicted, are performed as in the above-mentioned embodiment.

The electronic component 1 in this modified example is also mounted to a printed board or the like while the main face 2c or 2d faces up. Since only the electrode portions 3a, 3b, 3c, 3d, 4a, 4b, 4c, 4d of the outer electrodes 3, 4 are wettable by solder and conductive, the electronic component 1 enabling high-density mounting can be attained as in the above-mentioned embodiment. The insulating layers 20, 21 and the electrode layers 31, 41 are formed by simultaneous sintering and thus are joined to each other very firmly in this modified example as compared with the former modified example. This can construct the insulating layers 20, 21 with higher mechanical strength and heat resistance. When handling the electronic component 1 for mounting by soldering to a substrate, for example, no mechanical defects are caused by shocks in the insulating layers 20, 21. The insulating layers 20, 21 are also strong thermally and thus will not be damaged even if subjected to soldering at higher temperature. As a result of these, the electronic component 1 can be attained with very high reliability.

The first and second conductive paste layers and the glass paste layer are sintered integrally. Therefore, this modified example can eliminate the process of sintering the glass paste as compared with the former modified example, thereby cutting down the manufacture cost for the electronic component 1.

Though the preferred embodiment of the present invention has been explained in the foregoing, the present invention is not limited to the above-mentioned embodiment but can be modified in various ways within the scope not deviating from the gist thereof.

For example, as mentioned above, the insulating layers 20, 21 may be formed after forming the plating layers. The insulating layers 20, 21 may also be formed before forming the plating layers.

For example, the side faces 2e, 2f of the element body 2 may not be covered with the insulating layers 20, 21. That is, the surfaces of the electrode portions 3e, 3f, 4e, 4f located on the sides of the side faces 2e, 2f in the outer electrodes 3, 4 may be covered alone with the insulating layers 20, 21.

The present invention is applicable not only to the multilayer capacitors, but also to other electronic components such as multilayer inductors, multilayer varistors, multilayer piezoelectric actuators, multilayer thermistors, and multilayer composite components.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An electronic component comprising:
    an element body having a pair of end faces opposing each other, a pair of main faces opposing each other while extending so as to connect the pair of end faces to each other, and a pair of side faces opposing each other while extending so as to connect the pair of main faces to each other;
    an outer electrode, formed on one end face of the pair of end faces, for covering portions of the main faces and side faces adjacent to one end face; and
    an insulating layer that covers surfaces of electrode portions of the outer electrode located on the portions of the side faces, without covering the portions of the main faces that are not covered by the outer electrode,
    wherein the insulating layer covers areas of the pair of side faces that are not covered by the outer electrode, and
    the insulating layer is directly formed on the electrode portions of the outer electrode and the area of the pair of side faces.

2. An electronic component according to claim 1, wherein one main face of the pair of main faces is not covered by the insulating layer, the one main face being exposed from the insulating layer.

3. An electronic component according to claim 1, wherein the insulating layer is opaque or colored.

4. An electronic component according to claim 1, wherein the pair of side faces are perpendicular to a mounting surface when the electric component is mounted.

5. An electronic component comprising:
    an element body having a pair of end faces opposing each other, a pair of main faces opposing each other while extending so as to connect the pair of end faces to each other, and a pair of side faces opposing each other while extending so as to connect the pair of main faces to each other;
    an outer electrode, formed on one end face of the pair of end faces, for covering portions of the main faces and side faces adjacent to the end face adjacent to the one end face; and
    an insulating layer that covers surfaces of electrode portions of the outer electrode located on the portions of the side faces, without covering the portions of the main faces that are not covered by the outer electrode,
    wherein the insulating layer covers areas of the pair of side faces that are not covered by the outer electrode, and
    the insulating layer is in direct contact with the electrode portions of the outer electrode and the areas of the pair of side faces.

* * * * *